United States Patent
Weng et al.

(10) Patent No.: US 10,513,432 B2
(45) Date of Patent: Dec. 24, 2019

(54) ANTI-STICTION PROCESS FOR MEMS DEVICE

(71) Applicant: Taiwan Semiconductor Manufacturing Co., Ltd., Hsin-Chu (TW)

(72) Inventors: Jui-Chun Weng, Taipei (TW); Lavanya Sanagavarapu, Hsin-Chu (TW); Ching-Hsiang Hu, Taipei (TW); Wei-Ding Wu, Zhubei (TW); Shyh-Wei Cheng, Hsinchu County (TW); Ji-Hong Chiang, Changhua (TW); Hsin-Yu Chen, Hsinchu (TW); Hsi-Cheng Hsu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/904,085

(22) Filed: Feb. 23, 2018

(65) Prior Publication Data

US 2019/0031503 A1 Jan. 31, 2019

Related U.S. Application Data

(60) Provisional application No. 62/539,002, filed on Jul. 31, 2017.

(51) Int. Cl.
*B81C 1/00* (2006.01)
*H01J 37/34* (2006.01)
(Continued)

(52) U.S. Cl.
CPC .......... *B81C 1/0092* (2013.01); *B81B 3/0005* (2013.01); *B81C 1/0096* (2013.01); *B81C 1/00349* (2013.01); *B81C 1/00357* (2013.01); *B81C 1/00373* (2013.01); *B81C 1/00682* (2013.01); *B81C 1/00912* (2013.01);
(Continued)

(58) Field of Classification Search
CPC ........... B81C 1/00349; B81C 1/00357; B81C 1/00373; B81C 1/0092; B81C 1/00928; B81C 1/00936; B81C 1/00944; B81C 1/00952; B81C 1/0096; B81C 1/00968; B81C 1/00984; B81C 1/00992; H01L 21/02499; H01L 21/02518
See application file for complete search history.

(56) References Cited

U.S. PATENT DOCUMENTS

7,211,898 B2 * 5/2007 Lee .................... H01L 27/12
257/759
7,367,232 B2 * 5/2008 Vaganov ............... G01P 15/123
73/514.33
(Continued)

*Primary Examiner* — Eduardo A Rodela
(74) *Attorney, Agent, or Firm* — Duane Morris LLP (57) ABSTRACT

A method for treating a micro electro-mechanical system (MEMS) component is disclosed. In one example, the method includes the steps of providing a first wafer, treating the first wafer to form cavities and at least an oxide layer on a top surface of the first wafer using a first chemical vapor deposition (CVD) process, providing a second wafer, bonding the second wafer on a top surface of the at least one oxide layer, treating the second wafer to form a first plurality of structures, depositing a layer of Self-Assembling Monolayer (SAM) to a surface of the MEMS component using a second CVD process.

20 Claims, 8 Drawing Sheets

(51) Int. Cl.
*H01L 21/02* (2006.01)
*B81B 3/00* (2006.01)

(52) U.S. Cl.
CPC ...... *B81C 1/00928* (2013.01); *B81C 1/00992*
(2013.01); *H01J 37/3405* (2013.01); ***H01J
37/347* (2013.01); *H01J 37/3414*** (2013.01);
*H01J 37/3461* (2013.01); *H01L 21/02499*
(2013.01); *H01L 21/02518* (2013.01); *B81B
2201/025* (2013.01); *B81B 2201/0235*
(2013.01); *B81B 2201/0242* (2013.01); *B81B
2207/012* (2013.01); *B81C 2201/0133*
(2013.01); *B81C 2201/112* (2013.01); *B81C
2203/035* (2013.01)

(56) References Cited

U.S. PATENT DOCUMENTS

2014/0239353 A1* 8/2014 Daneman ............ B81C 1/00158
257/254
2018/0366317 A1* 12/2018 Ke ...................... H01L 21/0271
2019/0035905 A1* 1/2019 Kim ................... H01L 29/4933

* cited by examiner

ANTI-STICTION PROCESS FOR MEMS DEVICE

CROSS-REFERENCE TO RELATED APPLICATION

The present application claims priority to U.S. Provisional Patent Application No. 62/539,002, filed on Jul. 31, 2017, which is incorporated by reference herein in its entirety.

BACKGROUND

Micro electro-mechanical systems (MEMS) motion sensors are now widely used in automotive electronics, medical equipment, hard disk drives, and portable consumer electronics. For example, a typical smart phone includes a MEMS accelerometer, gyroscope and possibly a compass. Single-axis MEMS accelerometers detect a change in velocity in a given direction, which are almost universally used to inflate automotive airbags in the event of crashes. They are also used as vibration sensors to detect bearing wear in machinery, since vibration can be modeled as acceleration and deceleration happening quickly in a periodic manner. Two-axis accelerometers implement a second dimension, which can be as simple as detecting tilt by measuring the effect of gravity on the X-Y axis of the accelerometer. Three-axis accelerometers can detect motion in three different directions, which are widely used in mobile devices to incorporate tap, shake and orientation detection. Gyroscopes are basically three-axis inertial sensors. Multi-axis MEMS gyroscopes are often embedded along with three-axis accelerometers in inertial measurement units.

A capacitor is one of key components in determining MEMS device performance. The square measure of a capacitor contributes to the sensitivity of motion sensing circuit. The movable MEMS components with relatively larger dimension can get easily stuck, either to another movable MEMS component or to MEMS structures surrounding it.

Stiction is considered a significant problem in MEMS motion sensors. Internal MEMS structures are so small that surface forces can cause microscopic structures to stick together when their surfaces come into contact. Existing methods can only overcome the stiction issue by losing design performance, e.g. by compromising sensitivity performance of the MEMS motion sensor, and are thus not entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly.

Stiction is considered a significant problem in MEMS motion sensors. Internal MEMS structures are so small that surface forces can cause microscopic structures to stick together when their surfaces come into contact. The important surfaces forces are forces due to capillary condensation, van der Waals molecular forces, and chemical and hydrogen bonds (electrostatic) between the surfaces. The capillary force is related to factors such as contact area, hydrophobic surface, temperature and the density of liquid. The van der Waals molecular force is related to factors such as contact area and material type. The electrostatic force is related to factors such as dielectric charge, contact potential difference. Two of these three forces directly relate to contact area. As a result, if the surfaces are made hydrophobic, then the MEMS actuators will be easier to recover during operation in the presence of stiction.

Self-Assembled Monolayers (SAMs) of organic molecules are molecular assemblies formed spontaneously on surfaces by adsorption. SAM is a popular material and easy to add in a foundry process. Hydrophobicity is a SAM coat property and can retain after selective etch and patterning process. Contact angle measurements can be used to determine the surface free-energy which reflects the average composition of the surface of the SAM and can be used to probe the kinetics and thermodynamics of the formation of SAMs. The kinetics of adsorption and temperature induced desorption as well as information on structure can also be obtained in real time by ion scattering techniques such as low energy ion scattering and time of flight direct recoil spectroscopy.

The present disclosure provides an anti-stiction method for improving reliability and quality of a MEMS motion sensor, by reducing contact energy in the MEMS motion sensor. In one embodiment, a combo SAM processing is performed by thermal treatment and wet clean process in a sequential order. According to the disclosed method, SAM is completely removed from metal surface but remains on MEMS surface, which ensures bond quality and stiction free MEMS. This is a low cost solution and does not cause any side effect on MEMS device functioning.

Figure 1:
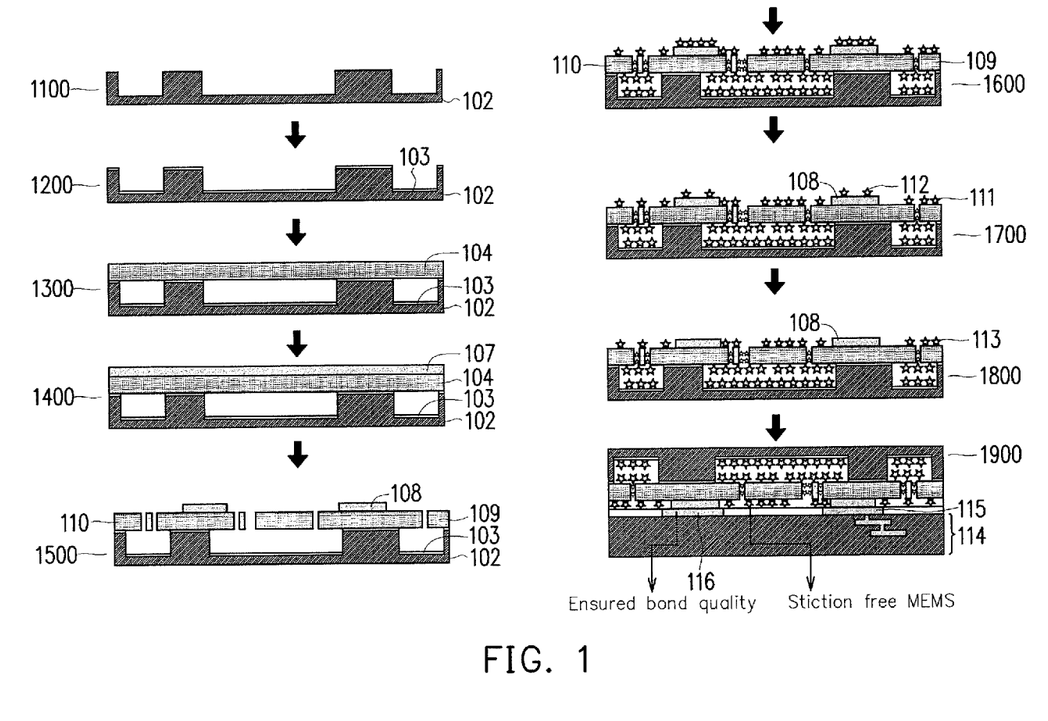
FIG. 1 is schematic illustration of a process for treating MEMS components to reduce stiction, in accordance with some embodiments.

FIG. 1 is a schematic illustration of the process for treating MEMS components to reduce stiction, in accordance with some embodiments. According to some embodiments, the first step 1100 forms upward facing cavities in the substrate 102, which is, for example, silicon, germanium or other materials. Such upward facing cavities may be formed by etching, for example. The resulting substrate with cavities 102 is then processed in the next step 1200. According to some embodiments, the substrate with cavities 102 is emerged in a chemical vapor during a chemical vapor deposition (CVD) process, wherein a layer of oxide 103 is deposited on the substrate with cavities 102. CVD is a chemical process implemented to produce high quality, high-performance, solid materials. The process is often implemented in the semiconductor industry to produce thin films. In a typical CVD, the wafer (substrate) is exposed to one or more volatile precursors, which react and/or decompose on the substrate surface to produce the desired deposited layer. Frequently, volatile byproducts are also produced, which are removed by gas flow through the reaction chamber (not shown). Microfabrication processes widely implement CVD to deposit materials in various forms, including: monocrystalline, polycrystalline, amorphous, and epitaxial. These materials include silicon compound (e.g. $SiO_2$, SiGe, silicon carbide, silicon nitride, and silicon oxynitride), carbon (fiber, nanofibers, nanotubes, diamond and graphene), fluorocarbons, filaments, tungsten, titanium nitride and various high-k dielectrics. In some embodiments, the oxide layer 103 is formed by thermal oxidation method.

According to some embodiments, in the next step 1300, another layer of a MEMS device wafer 104 is fused on the top of the oxide layer 103. In some embodiments, the MEMS device wafer 104 includes silicon (Si), germanium (Ge), or other suitable material(s). The MEMS device wafer 104 is provided to build MEMS devices and structure in the following steps.

According to some embodiments, in the next step 1400, a layer of Ge 107 is deposited on the MEMS device wafer 104 by physical vapor deposition (PVD), or sputtering. According to some embodiments, in the next step 1500, the Ge layer 107 is etched into a patterned Ge layer 108 according to a predetermined design. Additionally, actuators 109 and 110 are created by etching the MEMS device wafer 104.

According to some embodiments, the next step 1600 is the SAM coating step, in which the end product of step 1500 is emerged in chemical vapor for CVD. In some embodiments, the SAM is contained in the chemical vapor and a SAM layer 111 is deposited on both the external surfaces and internal surfaces of the MEMS component that can be reached by the chemical vapor containing SAM. According to some embodiments, SAM is a common material and easy to add in foundry process. For example, SAM may include molecules each of which that possesses a head group that has a strong affinity to the substrate and anchors the molecule to it. Exemplary head groups include but not limited to thiols, phosphonates, etc. The hydrophobicity of a SAM coating is retained after selective etching and patterning. According to some embodiments, by using the SAM coating, there is no additional mask or additional cost for MEMS reliability improvement. According to some embodiments, there is no side effect on MEMS device functionality.

According to some embodiments, in the next step 1700, the MEMS component undergoes a thermal treatment to at least partially remove the SAM on the metal surfaces. Compared to the step 1600, there are less SAMs 112 left on the surfaces of the metal layer 108, which includes metal or metalloid, at step 1700. According to some embodiments, the metal is Ge. The effect of the thermal treatment varies depending on the different combinations of temperature and duration of the thermal treatment. The effect of the thermal treatment also depends on the nature of the material surface, for example, the thermal treatments with the same temperature and duration introduce different effects on Si when compared to Ge. The effects of temperature, duration and material will be discussed in more detail in the following paragraphs.

According to some embodiments, in the next step 1800, wet etching is applied to completely remove the SAM deposition on the surface of layer 108. Compared to the step 1700, the SAMs 113 are only left on the surfaces of the actuators 109 and 110, but not on the surfaces of the metal layer 108 at step 1800.

According to some embodiments, in order to completely remove the SAM on the surface of layer 108, at least part of the layer 108 is also removed during the wet etching step 1800. According to some embodiments, wet etching is also known as chemical etching or liquid etching. Wet etching is a material removal process. During the process, liquid chemicals or etchants are used to remove materials from a wafer. While masks on the wafer form a specific pattern, materials that are not protected by the masks are etched away by liquid chemicals. Lithography may be used to deposit and pattern these masks on the wafers. A wet etching process can include multiple chemical reactions that consume the original reactants and produce new reactants. The wet etching process may include three basic steps: first, diffusion of the liquid etchant to the structure to be removed; second, the reaction between the liquid etchant and the material being etched away; and third, diffusion of the byproducts in the reaction from the reacted surface. Different from a surface clean process where all SAMs are removed from the MEMS surface, a wet etching at step 1800 may remove the SAM from the metal surfaces but keep the SAM on the other portions of the MEMS surface, e.g. the surfaces of the actuators 109 and 110. As such, a wet etching at step 1800 provides a strong bonding when the MEMS is bond to CMOS wafer via the metal surfaces, and at the same time ensures a stiction free MEMS with the hydrophobic SAM remaining on the other portions of the MEMS surface.

According to some embodiments, an anisotropic wet etching is applied at step 1800. In this case, liquid etchants can etch crystalline materials at different rates depending on which crystal face is exposed to the etchant. The etching rate is very different based on the Si crystalline plane. The effect can allow for very high anisotropy, e.g. in materials like Si.

According to some embodiments, an isotropic wet etching is applied at step 1800. In this case, a mixture of hydrofluoric acid, nitric acid, and acetic acid (HNA) is the etchant solvent for Si. The etching rate depends on the concentrations of each etchant. Si dioxide or Si nitride is typically used as a masking material against HNA. When the reaction takes place, the material is removed laterally at a rate similar to the speed of etching downward, even for isotropic dry etching.

According to some embodiments, the top surface of the layer 108 which is in close contact with SAM deposition is also removed to ensure complete removal of the SAM deposition. According to some embodiments, in order to achieve the desired effect, the wet etching step 1800 follows the thermal treatment step 1700. The effects of the order of the thermal treatment step and the wet etch step in SAM removal will be discussed in more detail in paragraphs associated with FIG. 7 below.

According to some embodiments, in the next step 1900, eutectic bonding is implemented to bond the properly treated MEMS wafer to a complementary metal-oxide-semiconductor (CMOS) wafer 114. The components 115 and 116 at the points of bonding are, for example, aluminum copper alloy or another suitable metallic material.

A eutectic system is a homogeneous solid mix of atomic and/or chemical species, where each pure element has its own distinct bulk lattice arrangement. Eutectic alloys have multiple materials and have a eutectic composition. Eutectic bonding is a wafer bonding technique with an intermediate metal layer produces a eutectic system. Those eutectic metals are alloys that transform directly from solid to liquid, or vice versa from liquid to solid, at a specific composition and temperature without passing a two-phase equilibrium with liquid and solid state. It is important in eutectic bonding that the eutectic temperature can be much lower than the melting temperature of the multiple pure elements.

When a non-eutectic alloy solidifies, its components solidify at different temperatures, exhibiting a plastic melting range. In contrast, when a well-mixed, eutectic alloy melts, it does so at a single and sharp temperature. Eutectic alloys are deposited by sputtering, dual source evaporation or electroplating or formed by diffusion reactions of pure materials and subsequent melting of the eutectic composition. Eutectic bonding is able to produce hermetically sealed packages and electrical interconnection within a single process. When a eutectic bonding process is implemented at low processing temperatures, the process produces low resultant stress induced in a final assembly and yields high bonding strength. In addition, the process increases fabrication yield and improves reliability.

When the properly treated MEMS wafer is bound to the CMOS wafer through eutectic bonding in step 1900, the contact energy of the MEMS components is reduced. There are remaining SAMs on the surface of the MEMS wafer, i.e. between the MEMS wafer and the CMOS wafer. Due to the hydrophobicity property of the remaining SAMs, the effective contact area on the surface of the MEMS wafer, e.g. between the MEMS wafer and the CMOS wafer, is reduced, which causes the stiction force to decrease or diminish accordingly.

Such anti-stiction technology substantially improves the reliability of MEMS motion sensors, for example. According to some embodiments, for bindings between wafers involving semiconductor materials, such as Ge, SAM coated on the surface of metal tends to degrade the bondability. According to some embodiments, an isotropic SAM coating followed by thermal treatment removes most of the SAM coating on metals. According to some embodiments, thermal treatment makes a surface less hydrophobic and provides an opportunity for a wet etch chemical to penetrate and completely remove the SAM from a metal surface. According to some embodiments, the wet etching completely removes SAM by etching the metal while keeping the SAM on Si intact.

Figure 2A:
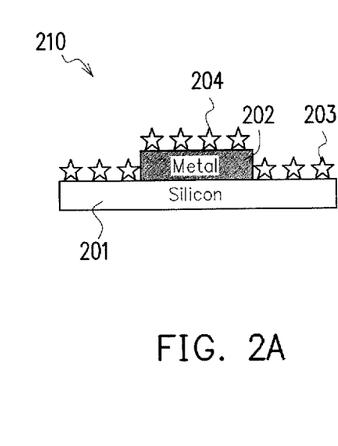
FIGS. 2A-2C are schematic illustrations of exemplary steps of applying a SAM coating, thermal treatment and wet etching, respectively, in accordance with some embodiments.
Figure 2B:
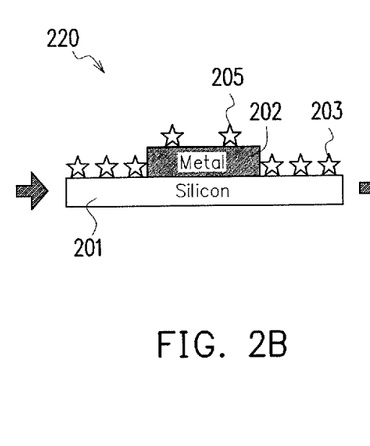
Figure 2C:
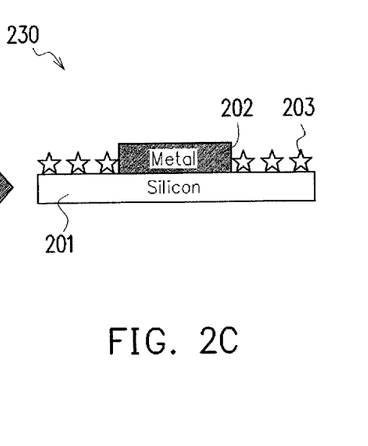

FIGS. 2A-2C are schematic illustrations of exemplary steps of applying a SAM coating, thermal treatment and wet etching, respectively, in accordance with some embodiments. According to some embodiments, 201 is a Si MEMS device wafer, and a metal layer 202, which includes metal or metalloid, is formed on top of the wafer 201. According to some embodiments, the metal layer 202 is a Ge layer. According to some embodiments, the layer 203 is a SAM layer coated on the top of the Si MEMS device wafer 201, and the layer 204 is a SAM layer coated on the top of the metal layer 202. According to some embodiments, the MEMS component 210 undergoes thermal treatment at a temperature for a period of time, and as a result, the SAM layer 204 coated on the top of the metal layer 202 is partially removed to become the thinned SAM layer 205 of the MEMS component 220. The effect of the temperature and duration of thermal treatment will be discussed in detail in the subsequent paragraphs. The effect of the sequence of thermal treatment and wet etching will also be discussed in more detail below.

According to some embodiments, the thermally treated MEMS component 220 further undergoes wet etching, which completely removes the SAM layer on the top of the metal layer 202. The resulting MEMS component is 230.

Figure 3:
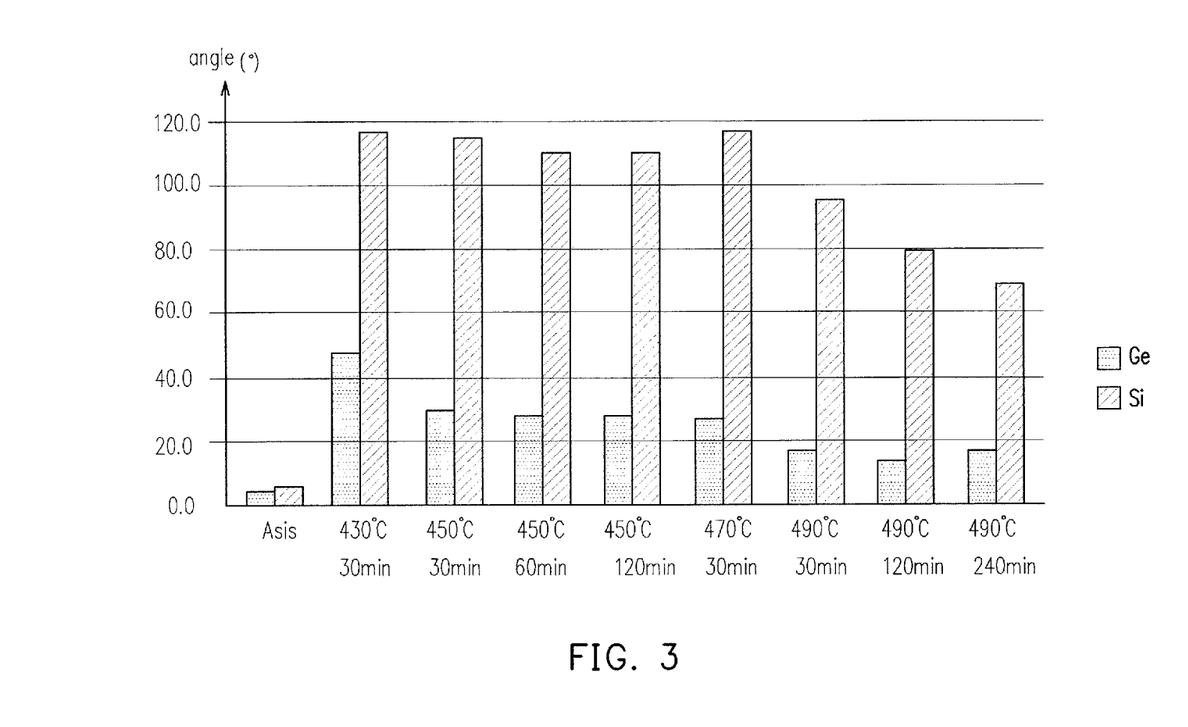
FIG. 3 is a chart illustrating contact angles on SAM with different thermal treatment temperatures and durations on silicon and germanium, in accordance with some embodiments.

FIG. 3 is a chart illustrating exemplary contact angles of the SAM with different thermal treatment temperatures and durations on Si and Ge, in accordance with some embodiments. According to some embodiments, two materials Ge and Si are treated and compared. The x-axis lists a plurality of different thermal treatment conditions, the first condition is "as is" meaning no thermal treatment is performed, the second condition is treatment (i.e., heating) at 430° C. for 30 minutes, the third condition is treatment at 450° C. for 30 minutes, the fourth condition is treatment at 450° C. for 60 minutes, the fifth condition is treatment at 450° C. for 120 minutes, the sixth condition is treatment at 470° C. for 30 minutes, the seventh condition is treatment at 490° C. for 30 minutes, the eighth condition is treatment at 490° C. for 120 minutes, and the ninth condition is treatment at 490° C. for 240 minutes. The height of each bar designates the SAM contact angle in degrees. The SAM contact angles on Si are larger than on Ge for all the treatment conditions listed. The SAM contact angles after the thermal treatment on Si are greater than that on thermal treated Ge. Therefore, in comparison with the thermal treated Ge under a same condition, the thermal treated Si has a tendency of hydrophobic effect.

Figure 4:
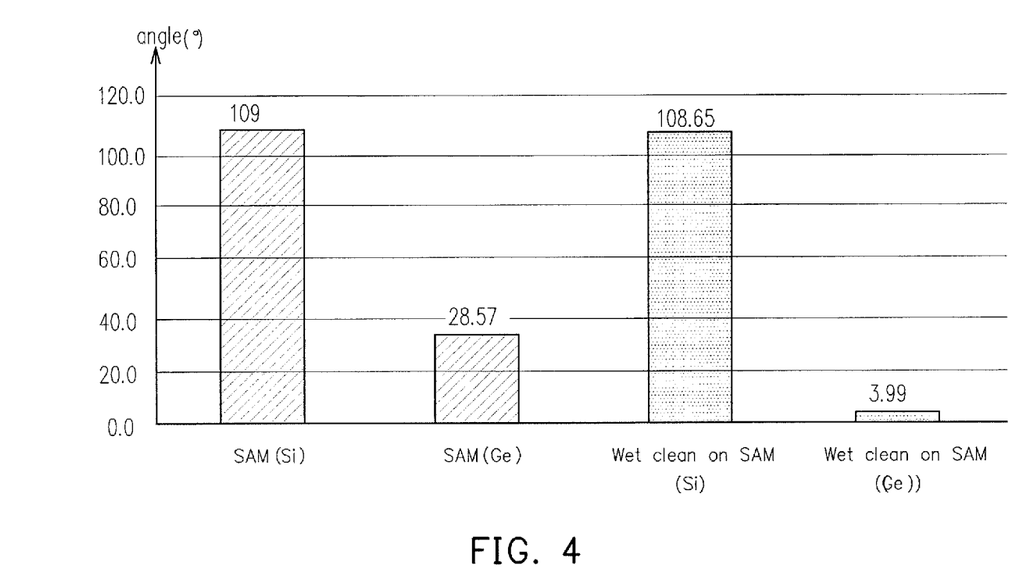
FIG. 4 is a chart illustrating contact angles of a SAM pattern by wet etch on silicon and germanium, in accordance with some embodiments.

FIG. 4 is a chart illustrating the contact angles of a SAM pattern by wet etching on Si and Ge, in accordance with some embodiments. According to some embodiments, the x-axis lists Si and Ge before and after wet etching treatment, and the y-axis lists contact angle in degrees. An angular difference before/after the wet etching treatment on the Si is smaller than that on the Ge. Therefore, on the surface of Si, it remains hydrophobic after wet etching, and on the surface of Ge, the wet etching makes the surface more hydrophilic.

Figure 5A:
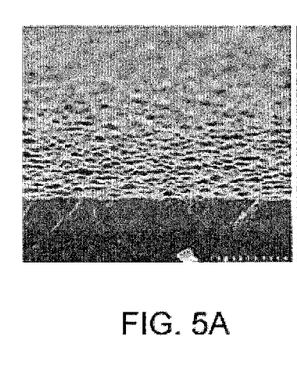
FIGS. 5A-5D are scanning electron microscopic photos illustrating one-time wet etch treatment, in accordance with some embodiments.
Figure 5B:
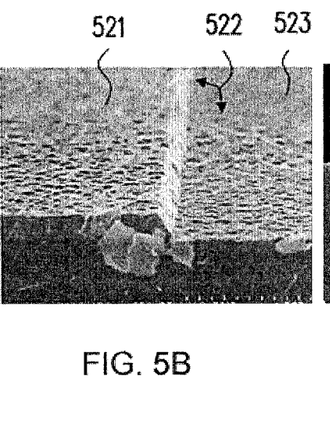
Figure 5C:
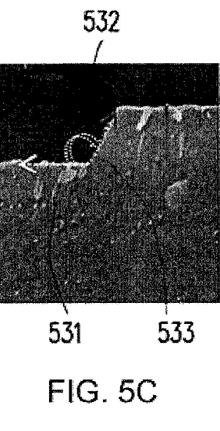
Figure 5D:
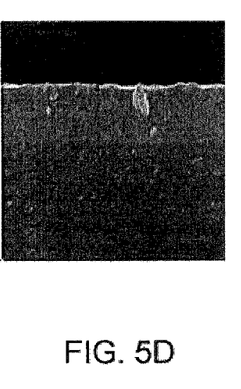

FIGS. 5A-5D are scanning electron microscopic (SEM) photos illustrating a one-time wet etching treatment, in accordance with some embodiments. According to some embodiments, FIGS. 5A and 5B are top views of the rough Ge after a one-time wet etching treatment, and FIGS. 5C and 5D are front views of Ge after the one-time wet etching treatment. The angle 532 in the front view photo FIG. 5C formed between the portion 531 and the portion 533 corresponds to the angle 522 in the top view photo FIG. 5B formed between the portion 521 and the portion 523. The effect of wet etching on the angle 532 will be discussed in more detail below.

Figure 5E:
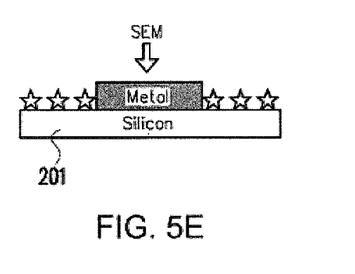
FIG. 5E is schematic illustration of a scanning electron microscope operation, in accordance with some embodiments.

FIG. 5E is schematic illustration of a scanning electron microscope on the top of a wafer surface, in accordance with some embodiments. The scanning electron microscope is facing down toward the surface of a wafer. For example, there is a layer of metal on surface of the Si wafer and a layer of SAM is coated. According to some embodiments, when the distance between the scanning electron microscope and the wafer surface is proper and other conditions are appropriately adjusted, the scanning electron microscope produces surface photos such as those shown in FIGS. 5A and 5B. When the front side of the wafer is facing the scanning electron microscope, FIGS. 5C and 5D are produced.

Figure 6A:
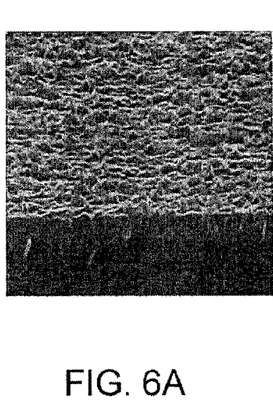
FIGS. 6A-6D are scanning electron microscopic photos illustrating multiple time wet etch treatment, in accordance with some embodiments.
Figure 6B:
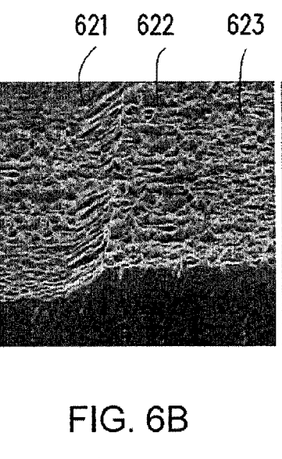
Figure 6C:
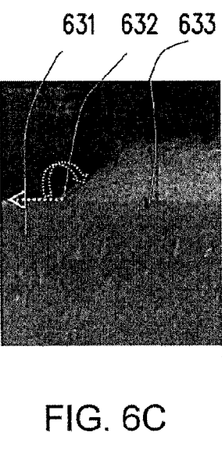
Figure 6D:
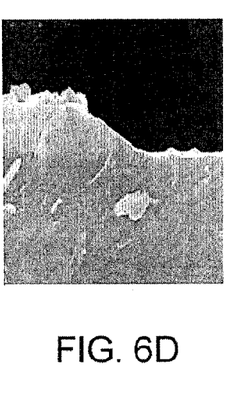

FIGS. 6A-6D are SEM photos illustrating multiple time wet etching treatment, in accordance with some embodiments. According to some embodiments, FIGS. 6A and 6B are top views of the rough Ge after multiple wet etching treatments, and FIGS. 6C and D are front views of Ge after the multiple wet etching treatments. The angle 632 in the front view photo FIG. 6C formed between the portion 631 and the portion 633 corresponds to the angle 622 in the top view photo FIG. 6B formed between the portion 621 and the portion 623. The effect of multiple wet etchings on the angle 532 makes the angle larger to become the angle 632, in accordance with some embodiments.

According to some embodiments, the wet etching not only completely removes the SAM layer, but also makes the Ge surface rougher. According to some embodiments, a rougher Ge surface helps to achieve better diffusion during the eutectic bonding process discussed earlier. The Ge surface after multiple wet etching treatments in FIGS. 6A and 6B are rougher compared to the surface in FIGS. 5A and 5B, which has only been treated with wet etching once. From the scanning electron microscopic photos, it is also clear that the Ge sidewall becomes more inclined after multiple wet etching.

Figure 7:
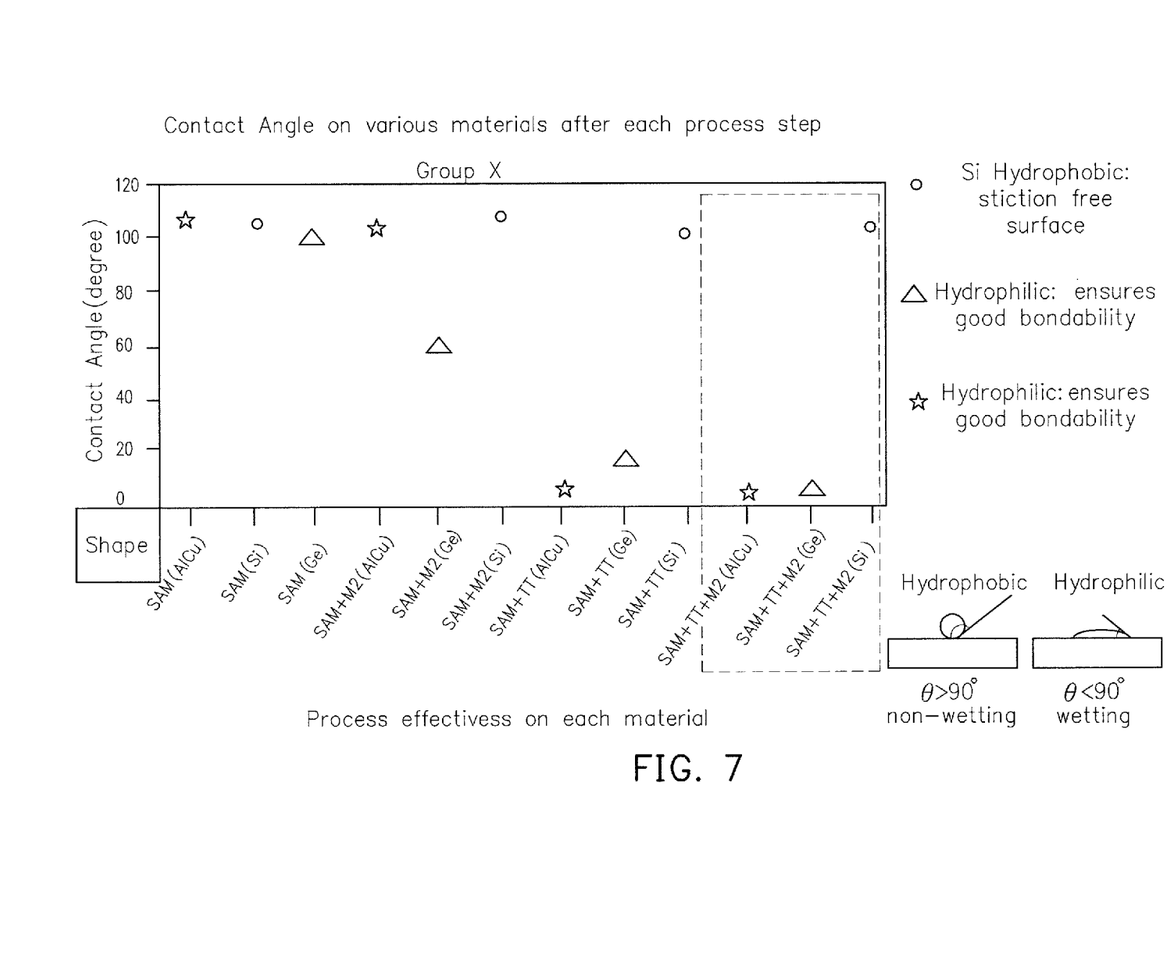
FIG. 7 is a chart illustrating contact angles on various materials after each process step, in accordance with some embodiments.

FIG. 7 is a chart illustrating the contact angles on various materials after each process step, in accordance with some embodiments. According to some embodiments, the x-axis lists different materials under different treatments: SAM treatment of AlCu, SAM treatment of Si, SAM treatment of Ge, SAM treatment and wet etching treatment of AlCu, SAM+wet etching treatment of Ge, SAM+wet etching treatment of Si, SAM+thermal treatment of AlCu, SAM+thermal treatment of Ge, SAM+thermal treatment of Si, SAM+thermal+wet etching treatment of AlCu, SAM+thermal+wet etching treatment of Ge and SAM+thermal+wet etching treatment of Si. The y-axis designates the corresponding contact angles in degrees. Among all the treatment scenarios, SAM(Si), SAM+wet etching (Si), SAM+Thermal Treatment (Si), and SAM+Thermal Treatment+wet etching (Si) are Si hydrophobic which produce stiction free surface. Among all the treatment scenarios, SAM (Ge), SAM+wet etching (Ge), SAM+Thermal Treatment (Ge), and SAM+Thermal Treatment+wet etching (Ge) are hydrophilic which ensure good bondability. Among all the treatment scenarios, SAM (AlCu), SAM+wet etching (AlCu), SAM+Thermal Treatment (AlCu), and SAM+Thermal Treatment+wet etching (AlCu) are also hydrophilic which ensure good bondability.

According to some embodiments, the last three treatment scenarios (shown in dashed lines) followed a treatment order as follows: SAM coating, then thermal treatment, then wet etching. The chart shows that when such an order is followed, in the embodiments of the last three data points, i.e., SAM+Thermal Treatment+wet etching (AlCu), SAM+Thermal Treatment+wet etching (Ge) and SAM+Thermal Treatment+wet etching (Si), better treatment results can be achieved, as demonstrated by small contact angles on metals and large contact angles on Si in FIG. 7. According to some embodiments, for Si surface, the SAM remains on the surface after the wet etching where the contact angles are around 100 degrees as shown in FIG. 7. As a comparison, for metal surfaces, SAM can be removed to produce contact angles smaller than 10 degrees, which guarantees bond quality. According to some embodiments, if the contact angles are larger than 90 degrees, the surface is hydrophobic, or non-wetting, as shown immediately to the right of the chart in FIG. 7. As a comparison, if the contact angles are smaller than 90 degrees, then the surface is hydrophilic, or wetting, as shown in the far right of FIG. 7.

Figure 8A:
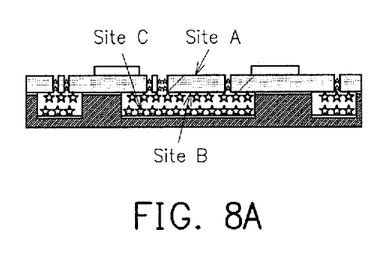
FIGS. 8A-8D are figures for comparing the binding energies of three different sites on the MEMS, in accordance with some embodiments.
Figure 8B:
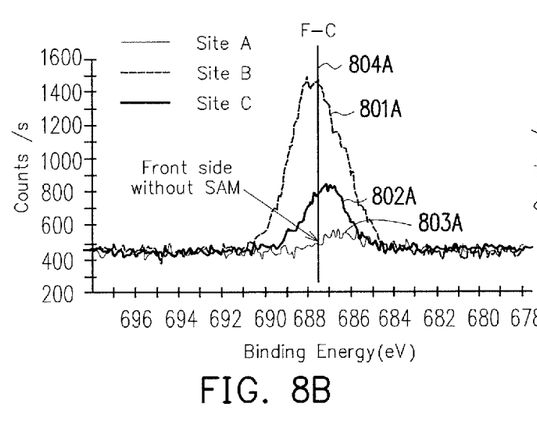

FIGS. 8A-8D are figures for comparing the binding energies of three different sites on the MEMS device with and without the SAM coating+thermal treatment+wet etching treatment process, as illustrated in FIGS. 1A and 1B, in accordance with some embodiments. According to some embodiments, FIG. 8A illustrates three sites, the front site (site A), the back site (site B) and the cavity site (site C), on the MEMS device treated without using the treatment process illustrated in FIGS. 1A and 1B, and FIG. 8B illustrates the corresponding bonding energy of those three sites, with curve 801A illustrating the binding energy of site B, curve 802A illustrating the binding energy of site C, and curve 803A illustrating the binding energy of site A.

Figure 8C:
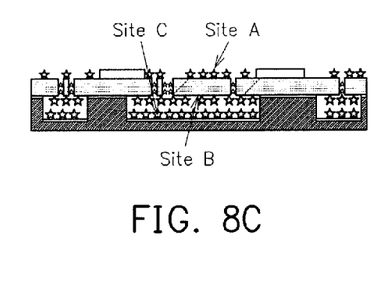
Figure 8D:
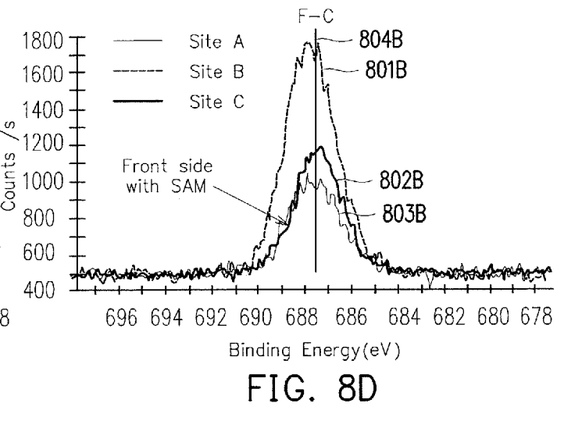

In comparison, FIG. 8C illustrates three similar sites, the front site (site A), the back site (site B) and the cavity site (site C), on the MEMS device treated using the treatment process illustrated in FIG. 1, and FIG. 8D illustrates the corresponding bonding energy of those three sites, with curve 801B illustrating the binding energy of site B, curve 802B illustrating the binding energy of site C, and curve 803B illustrating the binding energy of site A. FIG. 8C shows the presence of SAM on all sites, including site A, after the SAM removal process.

By comparing FIGS. 8B and 8D, the binding energies of all three sites become larger after the treatment process illustrated in FIG. 1. The most significant increase in binding energy is observed on the front site, or site A, from around 500 to around 1000. The increase in binding energy on the cavity site, or site C, is from around 800 to around 1200. The increase in binding energy on the back site, or site B, is from around 1500 to around 1700. The center value of the binding energy appears to be the same with and without using the treatment process, as illustrated by 804A and 804B in FIGS. 8C and 8D respectively. According to some embodiments, F-C is Fluorine-Carbon binding energy.

According to some embodiments, a method for treating a micro electro-mechanical system (MEMS) component is disclosed. The method includes the steps of providing a first wafer, e.g. a substrate wafer, treating the first wafer to form cavities and at least an oxide layer on a top surface of the first wafer using a first CVD process, providing a second wafer, bonding the second wafer on a top surface of the at least one oxide layer, treating the second wafer to form a first plurality of structures, depositing a layer of Self-Assembling Monolayer (SAM) to a surface of the MEMS component using a second CVD process. According to some embodiments, the step of treating the first wafer further comprises the step of etching the first wafer to create a first plurality of upward facing cavities. According to some embodiments, the step of treating the first wafer further comprises the step of depositing an oxide layer on the top of the substrate with the first plurality of the upward facing cavities using a first CVD process, wherein the first chemical vapor contains at least the oxide. According to some embodiments, the step of treating the second wafer further comprises the step of fusing the second wafer on a top of the at least one oxide layer, and etching the second wafer to form a second plurality of structures. According to some embodiments, the step of treating the second wafer further comprises the step of depositing a layer of Ge over the second wafer using physical CVD process. According to some embodiments, the step of treating the second wafer further comprises the step of etching the layer of Ge to form the second plurality of structures. According to some embodiments, the step of treating the second wafer further comprises the step of etching the second wafer to form a plurality of MEMS actuators.

According to some embodiments, the process further includes the step of treating the MEMS component by maintaining a temperature at a constant value for a period of time to partially remove the layer of SAM. According to some embodiments, the process further includes the step of wet etching the MEMS component to completely remove the layer of SAM. According to some embodiments, the process further includes the step of bonding the MEMS component to a CMOS wafer using eutectic bonding. According to some embodiments, the temperature is 450 degrees Celsius. According to some embodiments, the period of time is 30 minutes.

According to some embodiments, a process for treating a micro electro-mechanical system (MEMS) component is disclosed. The process includes the steps of providing the MEMS component, depositing a layer of Self-Assembling Monolayer (SAM) to the MEMS component using a CVD process, the chemical vapor contains at least the SAM. According to some embodiments, the process further includes the step of treating the MEMS component by maintaining a temperature at a constant value for a period of time to partially remove the SAM coating on the layer of Ge. According to some embodiments, the process further includes the step of wet etching the MEMS component to completely remove SAM on the layer of Ge. According to some embodiments, the process further includes the step of bonding the MEMS component to a CMOS wafer using eutectic bonding. According to some embodiments, the temperature is in a rage of 430 to 490 degrees Celsius. According to some embodiments, the period of time is in a range of 30 to 240 minutes.

According to some embodiments, a device is disclosed. The device includes a first wafer, wherein the first wafer comprises a first plurality of cavities and a second plurality of layers, a second wafer bonded over the first wafer, wherein the second wafer comprises a third plurality of structures and a fourth plurality of layers, and a CMOS wafer eutecticly bonded to the second wafer, wherein the first wafer and the second wafer are coated with SAM. According to some embodiments, the SAM is coated to a surface that has a contact angle larger than 90 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method comprising the steps of:
    providing a first wafer;
    treating the first wafer to form cavities and at least one oxide layer on a top surface of the first wafer using a first chemical vapor deposition process;
    providing a second wafer;
    bonding the second wafer on a top surface of the at least one oxide layer;
    treating the second wafer to form a first plurality of structures, wherein treating the second wafer further comprises etching a layer of germanium over the second wafer to form a second plurality of structures; and
    depositing a layer of Self-Assembling Monolayer (SAM) to a surface of a micro electro-mechanical system (MEMS) component using a second chemical vapor deposition process.

2. The method of claim 1, wherein the step of treating the first wafer further comprises the step of:
    etching the first wafer to create a first plurality of upward facing cavities.

3. The method of claim 2, wherein the step of treating the first wafer further comprises the step of:
    depositing an oxide layer on the top of the first wafer with the first plurality of the upward facing cavities using the first chemical vapor deposition process, wherein the first chemical vapor contains at least the oxide.

4. The method of claim 1, wherein the step of treating the second wafer further comprises the step of:
    fusing the second wafer on a top of the at least one oxide layer; and
    etching the second wafer to form the second plurality of structures.

5. The method of claim 1, wherein the step of treating the second wafer further comprises the step of:
    depositing the layer of germanium over the second wafer using a physical vapor deposition process.

6. The method of claim 1, wherein the step of treating the second wafer further comprises the step of:
    etching the second wafer to form a plurality of MEMS actuators.

7. The method of claim 6, further comprises the step of:
    treating the MEMS component by maintaining a temperature at a constant value for a period of time to partially remove the layer of SAM on the layer of germanium.

8. The method of claim 7, wherein the temperature is in a range of 430 to 490 degrees Celsius.

9. The method of claim 7, wherein the period of time is in a range of 30 to 240 minutes.

10. The method of claim 7, further comprises the step of:
    wet etching the MEMS component to completely remove the layer of SAM on the layer of germanium.

11. The method of claim 10, further comprises the step of:
bonding the MEMS component to a complementary metal-oxide-semiconductor (CMOS) wafer using eutectic bonding.

12. A process, the process comprising the steps of:
providing a micro electro-mechanical system (MEMS) component that comprises a layer of germanium;
depositing a layer of Self-Assembling Monolayer (SAM) to the MEMS component using a chemical vapor deposition process; and
maintaining a temperature of the MEMS component at a value for a period of time to partially remove the layer of SAM on the layer of germanium.

13. The process of claim 12, further comprises the step of:
wet etching the MEMS component to completely remove the layer of SAM on the layer of germanium.

14. The process of claim 13, further comprises the step of:
bonding the MEMS component to a CMOS wafer using eutectic bonding.

15. The process of claim 12, wherein the temperature is in a range of 430 to 490 degrees Celsius.

16. The process of claim 12, wherein the period of time is in a range of 30 to 240 minutes.

17. A method, comprising:
providing a micro electro-mechanical system (MEMS) component that comprises a layer of germanium;
depositing a layer of Self-Assembling Monolayer (SAM) to the MEMS component; and
wet etching the MEMS component to completely remove the layer of SAM on the layer of germanium.

18. The method of claim 17, further comprising:
bonding the MEMS component to a CMOS wafer.

19. The method of claim 18, wherein the MEMS component is bonded to the CMOS wafer based on a eutectic bonding.

20. The method of claim 17, wherein the layer of SAM is deposited based on a chemical vapor deposition process.

* * * * *